(12) United States Patent
Lemay

(10) Patent No.: US 11,255,929 B2
(45) Date of Patent: Feb. 22, 2022

(54) ELECTRONIC DEVICE FOR SENSING MAGNETIC FIELDS

(71) Applicant: QUINC.TECH INC., San Diego, CA (US)

(72) Inventor: Lee Lemay, San Diego, CA (US)

(*) Notice: Subject to any disclaimer, the term of this patent is extended or adjusted under 35 U.S.C. 154(b) by 248 days.

(21) Appl. No.: 16/367,230

(22) Filed: Mar. 27, 2019

(65) Prior Publication Data

US 2019/0302194 A1  Oct. 3, 2019

Related U.S. Application Data

(60) Provisional application No. 62/648,547, filed on Mar. 27, 2018.

(51) Int. Cl.
| | | |
|---|---|---|
| *G01R 33/00* | (2006.01) | |
| *G01R 33/035* | (2006.01) | |
| *H01L 39/22* | (2006.01) | |

(52) U.S. Cl.
CPC ..... *G01R 33/0358* (2013.01); *G01R 33/0356* (2013.01); *H01L 39/223* (2013.01)

(58) Field of Classification Search
CPC .......................... G01R 33/00; G01R 33/0035; G01R 33/0023; G01R 33/0017; G01R 31/3191; G01R 33/0358; G01R 33/0356; G01B 7/004; G01C 17/38; G06F 3/017; G06F 3/0346; G06F 3/012; H01L 39/223
See application file for complete search history.

(56) References Cited

U.S. PATENT DOCUMENTS

| | | | | |
|---|---|---|---|---|
| 8,179,133 | B1* | 5/2012 | Kornev | H03K 3/013 324/248 |
| 2012/0088674 | A1* | 4/2012 | Faley | H01C 1/14 505/162 |
| 2015/0380631 | A1* | 12/2015 | Taylor | H01L 39/225 257/31 |
| 2017/0071082 | A1* | 3/2017 | Sadleir | H05K 9/0077 |
| 2019/0079145 | A1* | 3/2019 | Leese de Escobar | G01R 33/0094 |
| 2019/0341540 | A1* | 11/2019 | Megrant | G06N 10/00 |

* cited by examiner

*Primary Examiner* — Patrick Assouad
*Assistant Examiner* — Taqi R Nasir
(74) *Attorney, Agent, or Firm* — Enrique Monteagudo, Esq.

(57) ABSTRACT

Aspects of the present disclosure generally pertain to a magnetic field sensor with flex coupling structures. Aspects of the present disclosure are more specifically directed toward Nanoscale Superconducting Quantum Interference Devices (nanoSQUIDs) with very low white flux noise characteristics can be fashioned into very sensitive magnetic field sensors by using external structures to increase the amount of flux that passes through the nanoSQUID aperture. One such structure is a superconducting coupling loop that shares part of a circuit with the nanoSQUID, and couples flux into the nanoSQUID primarily through kinetic inductance rather than geometric inductance.

20 Claims, 6 Drawing Sheets

ELECTRONIC DEVICE FOR SENSING MAGNETIC FIELDS

CROSS-REFERENCE TO RELATED APPLICATIONS

This application claims priority to U.S. provisional patent application 62/648,547 filed Mar. 27, 2018 entitled Magnetic Field Sensor with Flux Coupling Structures, the contents of which are incorporated herein by reference in its entirety.

STATEMENT OF FEDERALLY SPONSORED RESEARCH OR DEVELOPMENT.

This invention was made with government support under HR001118C0046 awarded by Defense Advanced Research Projects Agency (DARPA). The government has certain rights in the invention.

BACKGROUND OF THE INVENTION

Technical Field

The present disclosure generally pertains to mechanisms and methods for improving signal detection and amplification, and is more particularly directed towards mechanisms and methods for measuring magnetic fields with high sensitivity.

Related Art

The ability to measure magnetic fields with high sensitivity is an enabler for biomedical imaging and geophysical exploration. Low temperature superconductors operating at 4 degrees Kelvin can be fashioned into SQUIDs with sensitivities that are better than 1 femtoTesla/Hz$^{1/2}$. This level of sensitivity allows direct measurement of neural and muscular activity, which has enabled Magnetoencephalography (MEG) and other biomedical imaging. However, low temperature systems are expensive, and usually rely on liquid Helium, a finite resource which is expensive and may run out. Furthermore, low temperature superconductors require bulky insulating cryogenic systems, which mean that the SQUID sensor cannot be placed directly next to the subject. This standoff distance attenuates the signals that are being measured.

To overcome the expense, reliance on liquid Helium, bulky cryogenic apparatus, and to decrease the standoff distance, it is desirable to develop an equally sensitive SQUID from high temperature superconductors operating at up to 77 degrees Kelvin. However, high temperature SQUIDs have traditionally been orders of magnitude less sensitive than low temperature SQUIDs. This is due to material properties and higher temperatures that introduce a higher amount of white flux noise into their operation. Furthermore, lack of maturity in processing the high temperature superconducting materials have made it difficult to fabricate multi-layer structures out of the high temperature superconductor, which in turn has made it difficult to develop efficient multi-turn flux focusing coils.

In addition, current high temperature SQUIDs are made on the order of micrometers, which have inductance that contributes to the higher noise floor present in high temperature superconducting SQUIDs. For example, U.S. Pat. No. 5,767,043 to Cantor, et al. on Jun. 16, 1998, pertains to a multiple squid direct signal injection device formed on a single layer substrate. In particular, a low-noise directly coupled 10 micrometer gap dc SQUID magnetometer is disclosed. The magnetometer provides for single layer fabrication and is particularly applicable to high-T.sub.c superconductors operating at 77 Kelvin. A pair of dc SQUIDs are connected and biased in series such that the output voltage modulation with applied flux of the dual SQUID magnetometer, is double that of a single SQUID magnetometer. The bias current is applied to one SQUID and removed from the second SQUID of the pair. The magnetometer pick-up coil is directly coupled to the SQUID pair, providing for coherent modulation of the series-connected SQUIDS and a reduction of flux density noise of the device by a factor of 1/.sqroot.2.

Additional approaches have not resolved the above deficiencies identified by the inventor. For example, U.S. Pat. No. 6,690,162 to Schopohl, et al. on Feb. 10, 2004, pertains to a Device for high-resolution measurement of magnetic fields. In particular, a device is proposed for high-resolution measurement, in particular for high-resolution absolute measurement of magnetic fields, having a network (1) of transitions (3) between superconductors (5, 6) which exhibit Josephson effects, called junctions below, the network comprising closed meshes (7, 8, 9, 10, 11, 12, 13), denoted by cells below, which in each case have junctions (3), which junctions are connected in a superconducting fashion, and at least three of these cells being connected in a superconducting and/or nonsuperconducting fashion. The object of the invention consists in further developing this device in such a way that it is possible to make absolute measurements of magnetic fields in a highly sensitive fashion. This object is achieved by virtue of the fact that the junctions (3) of the at least three cells (7, 8, 9) can be energized in such a way that a time-variant voltage drops in each case across at least two junctions of a cell, the time average of which voltage does not vanish, and in that the at least three cells are configured differently geometrically in such a way that the magnetic fluxes enclosed by the cells in the case of an existing magnetic field differ from one another in such a way that the frequency spectrum of the voltage response function has no significant .PHI..sub.0-periodic component with reference to the magnetic flux.

The present disclosure is directed toward overcoming known problems and problems discovered by the inventor.

SUMMARY OF THE DISCLOSURE

Aspects of the present disclosure generally pertain to a magnetic field sensor with flex coupling structures. Aspects of the present disclosure more specifically are directed toward Nanoscale Superconducting Quantum Interference Devices (nanoSQUIDs) with very low white flux noise characteristics can be fashioned into very sensitive magnetic field sensors by using external structures to increase the amount of flux that passes through the nanoSQUID aperture. One such structure is a superconducting coupling loop that shares part of a circuit with the nanoSQUID, and couples flux into the nanoSQUID primarily through kinetic inductance rather than geometric inductance.

An electronic device for sensing magnetic fields is disclosed herein. The electronic device includes a first terminal, a second terminal, a superconducting loop electrically coupled in series between the first terminal and the second terminal, a first Superconducting Quantum Interference Device (SQUID) including a first superconducting trace, a second superconducting trace, and a first pair of Josephson Junctions electrically coupled in parallel between the first superconducting trace and the second superconducting trace. The first SQUID electrically is coupled in series between the first terminal via the first superconducting trace, and the superconducting loop via the second superconducting trace, said second superconducting trace forming a first segment of the superconducting loop, the first superconducting trace having a first trace length as measured between one junction end of each of the first pair of Josephson Junctions, said first trace length being less than 999 nm, the second superconducting trace having a second trace length as measured between an other junction end of each of the first pair of Josephson Junctions, said second trace length being at least twice the first trace length.

DETAILED DESCRIPTION

Aspects of the present disclosure generally pertain to a magnetic field sensor with flex coupling structures. Generally, Nanoscale Superconducting Quantum Interference Devices (nanoSQUIDs) with very low white flux noise characteristics can be fashioned into very sensitive magnetic field sensors by using external structures to increase the amount of flux that passes through the nanoSQUID aperture. One such structure is a superconducting coupling loop that shares part of a circuit with the nanoSQUID, and couples flux into the nanoSQUID primarily through kinetic inductance rather than geometric inductance.

In embodiments, the geometry of the nanoSQUID and coupling loop can be optimized to maximize the coupling of flux into the nanoSQUID via kinetic inductance. The amount of flux that passes through the coupling loop can be increased using secondary flux focusing structures such as Lenz lenses or pickup coils. The Lenz lens can also shield flux from entering parts of the circuit where flux is undesirable. The Lenz lens may also be integrated into a feedback loop to linearize the system's voltage output. To increase the sensitivity and voltage response of the device, multiple nanoSQUIDs may be patterned on the edge of the coupling loop in a series or parallel configuration. The devices described in this patent may be used in a SQUID cascade, which utilizes two or more independent devices with different sensitivities to achieve an extended dynamic range.

Further, the present disclosure addresses several of the above identified problems while mitigating additional system cost and additional complexity. Thus, this disclosure may be useful for providing an improved mechanisms and methods for measuring magnetic fields with high sensitivity Various aspects of the novel systems, devices, and methods are described more fully hereinafter with reference to the accompanying drawings. The detailed description set forth below in connection with the appended drawings is intended as a description of various configurations and embodiments, and is not intended to represent the only configurations in which the concepts described herein may be practiced. The detailed description includes specific details for the purpose of providing a thorough understanding of various concepts. In particular, it will be apparent to those skilled in the art that these concepts may be practiced without these specific details. In some instances, well known structures and components are shown in block diagram form in order to avoid obscuring such concepts.

Figure 1:
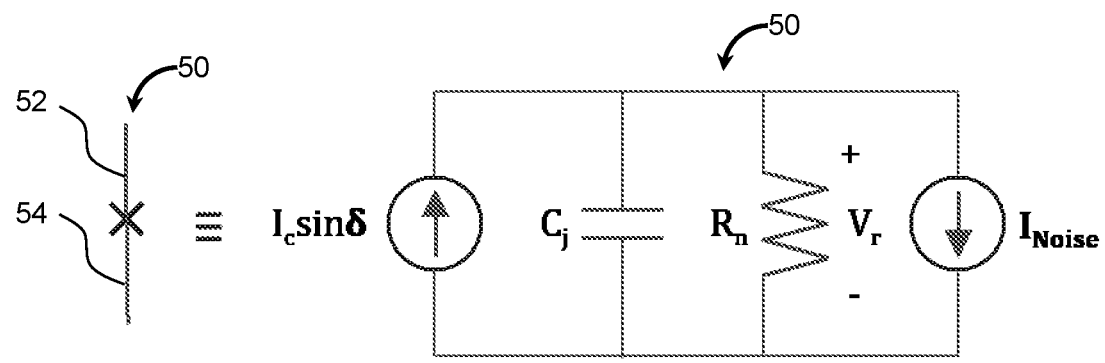
FIG. 1 schematically illustrates the RCSJ model with current noise for a Josephson Junction (JJ).

FIG. 1 schematically illustrates the RCSJ model with current noise for a Josephson Junction (JJ) 50. The JJ, denoted by an 'x' intersecting a line, is on the left, and the RCSJ model is on the right. It is generally understood that the JJ joins one side (junction end 52) to an other side (junction end 54). As illustrated, the quantity $\delta$ is the gauge invariant phase difference across the junction.

Figure 2:
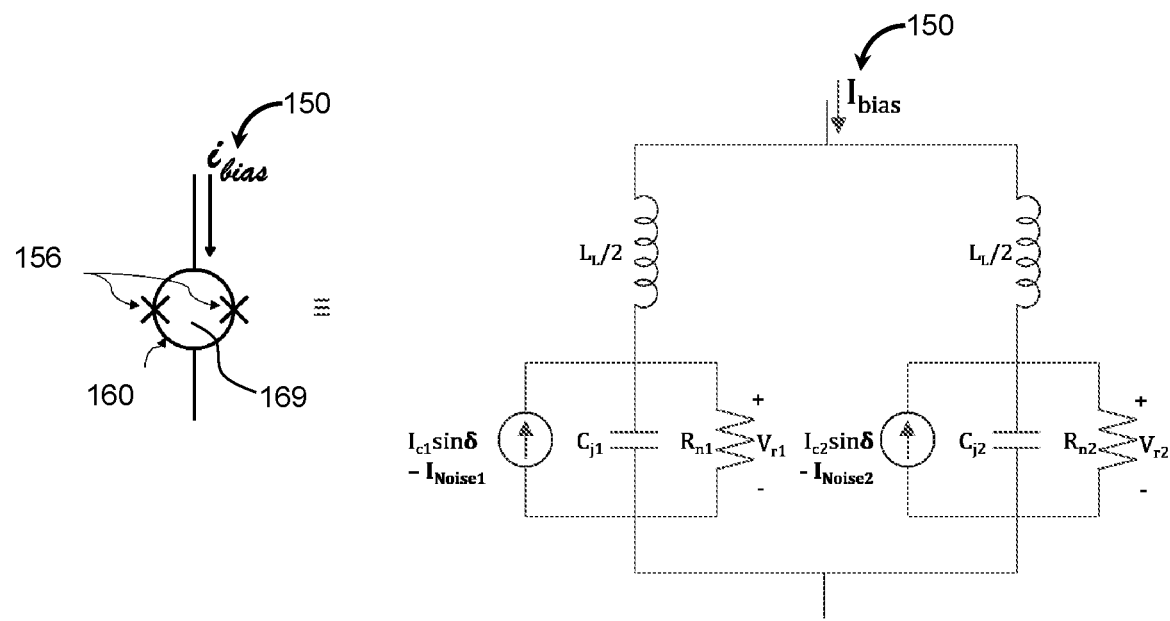
FIG. 2 schematically illustrates a DC SQUID approximated using the RCSJ model of FIG. 1.

FIG. 2 schematically illustrates a DC SQUID approximated using the RCSJ model of FIG. 1. The DC SQUID (SQUID 150) is denoted as a loop (superconducting SQUID loop 160) with two Josephson Junctions (pair of JJs 156), shown on the left. The circuit schematic for the SQUID 150 using the RCSJ model is shown on the right.

SQUIDs are non-linear devices that can be used, for example, to sense magnetic fields, or to divide the signal in a system into distinct channels, where each channel contains information about a different portion of the dynamic range of the signal. A DC SQUID is made from a superconducting loop that contains two Josephson Junctions (JJs). A JJ is a very thin break in the superconductor that allows a slight overlap in the electron pair wave functions between the two sides of the break.

The SQUID 150 may generally be made from a superconducting SQUID loop 160 containing at least one pair of JJs 156. The symbol for the JJ and the Resistively Capacitively Shunted Junction (RCSJ) model are shown in FIG. 1. The RCSJ model approximates the Josephson Junction as a current source shunted by a capacitor and a resistor. The current is sinusoidal as a function of the gauge invariant phase difference of the superconducting wave function across the junction. A current noise source is included here, although it is not always present in the RCSJ model.

As indicated by the electrical symbol, a superconducting SQUID loop may symmetrically couple the JJs. However, as discussed below, the superconducting SQUID loop 160 may asymmetrically (in at least one axis) couple the pair of JJs 156

As discussed below, one or more SQUIDs 150 may be incorporated into an electronic device 100 (FIG. 4) for sensing magnetic fields. Further, it is understood, that said electronic device 100 may include additional components (e.g., nanoSQUID electronics 200 FIG. 10) associated with the operation, use, and/or application of the electronic device 100, and particularly the SQUID 150. Moreover, any additional components including but not limited to the nanoSQUID electronics 200 may be electronically coupled via any appropriate means (e.g., wired, wirelessly, etc.).

To properly operate, the one or more SQUIDs 150 need to be cooled down below its critical temperature (i.e., the temperature at which its elements become superconducting). The cryogenic equipment (not shown) to cool the SQUID 150 down may consist of a cryocooler or a cryostat with a cooling mechanism, insulation system, and control system.

Likewise, the SQUIDs 150 must be shielded from magnetic fields that are not from the signal of interest. This can be done by placing a superconducting magnetic shield over them, or by configuring each SQUID 150 as a gradiometer. A gradiometer SQUID cancels out any common mode signal, and could be configured to be sensitive to the magnetic field produced by the signal of interest.

As illustrated, the inductance LL is the inductance of the superconducting SQUID loop 160, which is made up of both geometric and kinetic inductances. To overcome the higher noise floor present in high temperature superconducting SQUIDs, the SQUID 150 may be fashioned with extremely low inductance. When the inductance in the SQUID 150 is decreased, a given flux will induce a larger screening current in the device, thereby increasing the signal that is measured. Here, decreasing the inductance of the SQUID 150 may be accomplished by decreasing its size. In particular, the SQUID may be a "nanoSQUID", whose length, width, or both are measured in tens or hundreds of nanometers. For example, at least one dimension may be 999 nanometers or less.

Those skilled in the art will be familiar with SQUIDs in general, and will recognize "length" and "width" as corresponding to general dimensions of an aperture 169 formed by the superconducting SQUID loop 160 electrically coupling a pair of JJs, for example. The shape of the superconducting SQUID loop 160 may curved, rectilinear, or a combination thereof. According to one embodiment, and as discussed below, the superconducting SQUID loop 160 may be formed by a superconducting trace fixed to a substrate, electrically coupling each pair of junction ends 52, 54.

As a "nanoSQUID", the SQUID 150 may advantageously achieve very low inductance and very low white flux noise levels, much lower than traditional SQUIDs. Like a regular Direct Current (DC) SQUID, here the SQUID 150 is still composed of a superconducting loop (superconducting SQUID loop 160) with two JJs (pair of JJs 156).

Unlike traditional SQUIDS, here, the superconducting SQUID loop 160 in the center of the SQUID (aperture 169) is tens to hundreds of nanometers wide, and can be tens of nanometers to several microns long, having an exaggerated oblong or rectangular shape. The center of the loop, which is not superconducting, may be fashioned by removing the superconducting material, or by processing it to remove its superconductivity.

Figure 3:
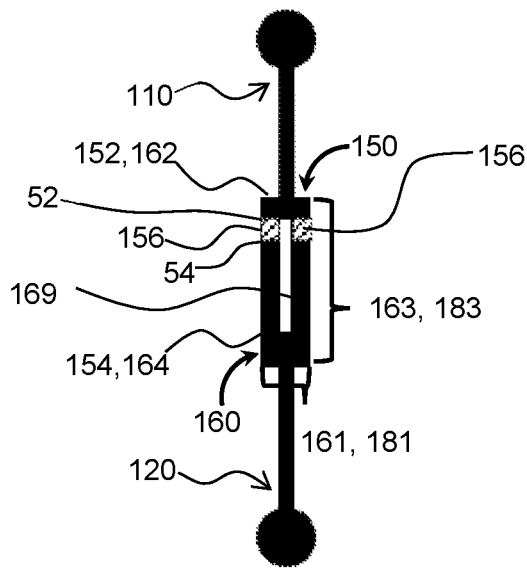
FIG. 3 shows a nanoSQUID, according to an exemplary embodiment of the present disclosure.

FIG. 3 shows a nanoSQUID, according to an exemplary embodiment of the present disclosure. As discussed above, the SQUID 150 may have an elongated or otherwise asymmetric shape. As illustrated, the SQUID 150 shows a possible geometry for a nanoSQUID for use in the electronic device 100 (FIG. 4) for sensing magnetic fields. As above, the SQUID 150 may include the superconducting SQUID loop 160 and the pair of Josephson Junctions (JJs) 156. As above, each JJ is a substantially a very thin break in the superconducting SQUID loop 160, however, the pair of JJs 156 are shown exaggerated in size for ease of illustration.

According to one embodiment, and as shown the superconducting SQUID loop 160 may include a first superconducting trace 152 and a second superconducting trace 154 joined at the pair of JJs 156. In particular, the pair of Josephson Junctions 156 are electrically coupled in parallel between the first superconducting trace 152 and the second superconducting trace 154. The SQUID 150 may be electrically coupled in series between a first terminal 110 via the first superconducting trace 152, and a second terminal 120 via the second superconducting trace 154.

For reference, the first superconducting trace 152 has a first trace length 162 as measured between one junction end 52 (FIG. 1) of each of the first pair of JJs 156, and the second superconducting trace 154 has a second trace length 164 as measured between the other junction end 54 (FIG. 1) of each of the first pair of JJs 156.

Further and as above, the superconducting SQUID loop 160 forms the aperture 169, which has Josephson Junction width 161 and a Josephson Junction depth 163. In this exemplary embodiment, the JJ width 161 is understood as corresponding to the physical distance between the pair of JJs 156, and the JJ depth 163 as corresponding to the physical distance perpendicularly away from the pair of JJs 156. For example, and as shown, here the aperture 169 is formed by the first superconducting trace 152 directly extending linearly between one junction end 52 of each of the pair of JJs 156, and the second superconducting trace 154 extending rectangularly between the other junction end 54 of each of the pair of JJs 156 (here, linearly departing one JJ 156, turning perpendicularly toward the other JJ 156, and then returning linearly to the other JJ 156.

According to one embodiment, the first superconducting trace 152 linearly couples the one junction ends 52 of each of the pair of Josephson Junctions 156, such that the first superconducting trace 152 defines the Josephson Junction width 161 and is substantially the same as first trace length 162. Further, the second superconducting trace 154 rectilinearly couples the other junction ends 54 of each of the first pair of Josephson Junctions 156, such that the second superconducting trace 154 defines the Josephson Junction insertion depth 163 (measured perpendicularly from the first superconducting trace 152) and the second trace length 164 is substantially the sum of the Josephson Junction width 161 and twice the Josephson Junction insertion depth 163.

According to one embodiment, the second trace length 164 may be substantially longer than the first trace length 162. For example, the second trace length 164 may be at least twice the first trace length 162. Also for example, the second trace length 164 may be at least seven times the first trace length 162. Also for example, the second trace length 164 may be at least twice twenty-five times the first trace length 162.

As above, the SQUID may be a "nanoSQUID", whose length, width, or both are measured in tens or hundreds of nanometers. According to one embodiment, the first trace length 162 may be less than 999 nm. According to another embodiment, the first trace length 162 may be 200 nm±50%, and the second trace length 162 may be 5000 nm±50%. Preferably, the first trace length 162 may be 200 nm±10%; and the second trace length 162 may be 5000 nm±10%.

Figure 4:
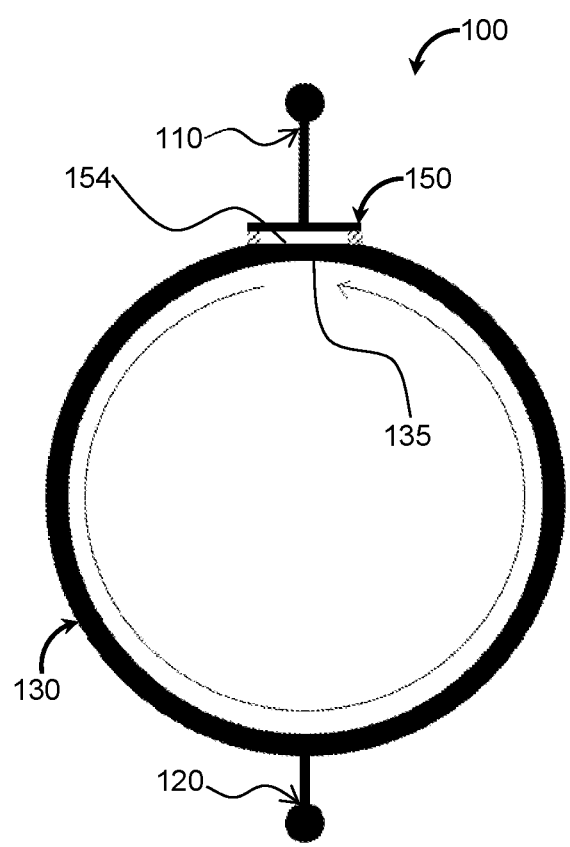
FIG. 4 shows a nanoSQUID oriented tangentially to a superconducting coupling loop.
Figure 5:
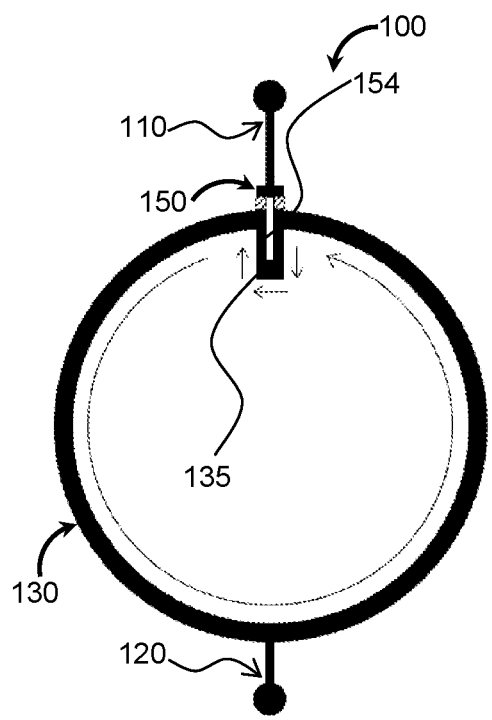
FIG. 5 shows a nanoSQUID oriented perpendicularly to a superconducting coupling loop, according to an exemplary embodiment of the present disclosure.

FIG. 4 shows a nanoSQUID oriented "tangentially" (i.e., JJ width>JJ depth) to a superconducting coupling loop. As above, one or more SQUIDs 150 may be incorporated into the electronic device 100 for sensing magnetic fields. Further, it is understood, that said electronic device 100 may include additional components (e.g., nanoSQUID electronics 200 FIG. 10) associated with the operation, use, and/or application of the electronic device 100, and particularly the SQUID 150. As shown, the electronic device 100 may include the first terminal 110, the second terminal 120, a superconducting coupling loop 130, and one or more SQUIDs 150 electrically coupled in series between the first terminal 110 and the second terminal 120. In particular, one or more SQUIDs 150 may be electrically coupled in series to the second terminal 120 via the superconducting coupling loop 130 (as shown), and/or electrically coupled in series to the first terminal 110 and via the superconducting coupling loop 130 (FIG. 5).

In the past nanoSQUIDs have been manufactured from Yttrium Barium Copper Oxides (YBCO), a high temperature superconductor, with similar white flux noise levels as low temperature SQUIDs. However, the sensitivity of the low temperature SQUIDs still exceeds the sensitivity of the high temperature nanoSQUIDs, because the nanoSQUIDs are very small and very little flux will enter the nanoSQUIDs' aperture.

To address this, SQUID 150 may be fabricated on the edge of the superconducting coupling loop 130. The superconducting coupling loop 130 may then directly couple flux into the SQUID 150. According to one embodiment, a long edge of the SQUID 150 may be coupled "tangentially" to an edge of the loop superconducting coupling loop 130 (e.g., the second superconducting trace 154 forming a segment 135 of the superconducting coupling loop 130).

By directly coupling flux of the superconducting coupling loop 130 into the SQUID 150, an "effective area" of the nanoSQUID (SQUID 150.) can be increased.

The increase in the effective area of the nanoSQUID can be analytically approximated according to the equation:

Effective Area=(nanoSQUID Area)+(Coupling Inductance)/(Loop Inductance)*Loop Area    (1)

Further, the coupling inductance can be approximated as:

Coupling Inductance=(nanoSQUID Geometric Inductance)/2+nanoSQUID Kinetic Inductance,    (2)

where the geometric inductance is that of a slit (aperture 169):

nanoSQUID Geometric Inductance≈0.3 pH/μm, and    (3)

the kinetic inductance comes from the shared edge of the nanoSQUID and the coupling loop:

nanoSQUID Kinetic Inductance/μm=$(\mu\_0 \lambda\_L)/w$ $\coth^{[i\circ]}(t/\lambda\_L)$    (4)

where $\mu\_0$ is the magnetic permeability, $\lambda\_L$ is the London penetration depth, w is the width of the shared edge between the nanoSQUID and the coupling loop, and t is the thickness of the superconducting film.

For a London penetration depth of 400 nm, film thickness of 30 nm, and trace width of 2 μm, the kinetic inductance is 3.4 pH/μm, over 11 times that of the geometric inductance per unit length. A London penetration depth of 400 nm is higher than is usual for typical YBCO devices but provides a better match to experimental data.

Even using this configuration of nanoSQUID fashioned on the edge of a coupling loop, oriented tangentially, high temperature superconducting SQUIDs might not achieve the same magnetic field sensitivity as low temperature SQUIDs.

FIG. 5 shows a nanoSQUID oriented "perpendicularly" (i.e., JJ width<JJ depth) to a superconducting coupling loop, according to an exemplary embodiment of the present disclosure. As above, the electronic device 100 may include the first terminal 110, the second terminal 120, the superconducting coupling loop 130, and one or more SQUIDs 150. Also, as above the second superconducting trace 154 may form a segment 135 of the superconducting coupling loop 130.

In this preferred embodiment, one or more SQUIDs 150 of the electronic device 100 may still be made from high temperature superconductor, yet may equal or exceed the sensitivities of low temperature SQUIDs. Advantageously, the potentially much greater performance may allow the electronic device 100 to be used as a magnetometer, in an analog gradiometer, or in a software defined gradiometer that performs gradiometry by subtracting signals from two different sensors.

In this preferred embodiment, the electronic device 100 features a more efficient coupling of flux from the superconducting coupling loop 130 into the SQUID 150. This is achieved by "rotating" the nanoSQUID (SQUID 150) approximately 90 degrees, so that it is oriented perpendicularly to the superconducting coupling loop 130.

The inventor has discovered, by rotating the SQUID 150 to be perpendicular rather than tangential to the coupling loop, it may significantly improve the performance of the SQUID 150, as it allows the same coupling inductance to be achieved as the tangentially oriented SQUID 150, but with a lower total inductance for the electronic device 100. Here, it can be seen that, for nanoSQUIDS of the same size, the edge that is shared between the perpendicular nanoSQUID and the coupling loop is longer than the edge that is shared between the tangential nanoSQUID and coupling loop. This longer edge will increase the kinetic inductance of the perpendicularly oriented nanoSQUID, all of which will contribute to the coupling inductance.

This in turn may allow the overall length of the perpendicularly oriented nanoSQUID to be decreased while still achieving the same amount of coupling as the tangentially oriented nanoSQUID. Decreasing the length (e.g., first trace length 162 plus second trace length 164) decreases the geometric inductance. As calculated above, because only half of the geometric inductance contributes to the coupling inductance, the overall inductance of the device is decreased while the coupling inductance stays the same. Thus, using a perpendicularly oriented nanoSQUID increases the sensitivity of the device.

Figure 6:
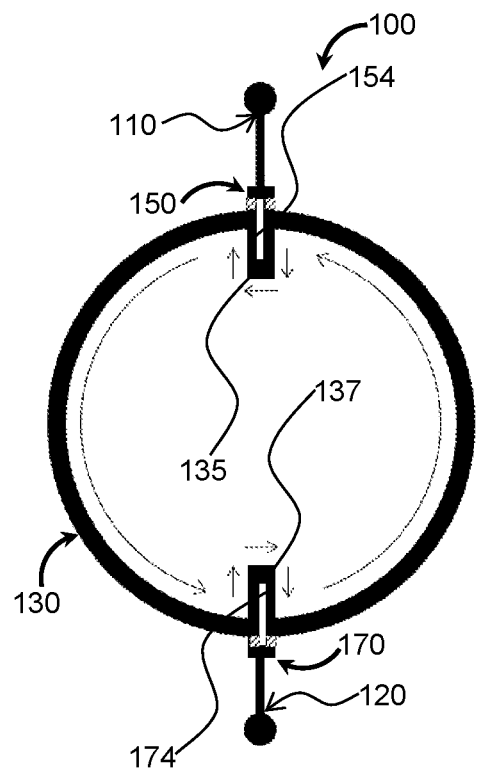
FIG. 6 shows two nanoSQUIDs connected to the same superconducting coupling loop, arranged in a series circuit, according to an exemplary embodiment of the present disclosure.

FIG. 6 shows two nanoSQUIDs connected to the same superconducting coupling loop, arranged in a series circuit, according to an exemplary embodiment of the present disclosure. In particular, two SQUIDs 150, 170 are electrically arranged in series, and both connected to the superconducting coupling loop 130.

As above, the electronic device 100 may include the first terminal 110, the second terminal 120, the superconducting coupling loop 130, and one or more SQUIDs 150, 170. Also, as above the second superconducting trace 154 may form a segment 135 of the superconducting coupling loop 130.

Here however, as above one superconducting trace 172 (having a shorter trace length, corresponding to its respective JJ width 181) may directly couple to the second terminal 120, and an other superconducting trace 174 (having a longer trace length, including its respective JJ depth 183) may form a second segment 137 of the superconducting coupling loop 130. Preferably, SQUID 150 may be identical to SQUID 170, other than its electrical placement.

Advantageously, this arranging the SQUIDs 150, 170 in this way may double an output voltage, while only increase the noise of the circuit by only √2, leading to a √2 increase in sensitivity. Further, this embodiment may require less wafer space than fabricating a second coupling loop with a second nanoSQUID on it and placing them in series with the first coupling loop.

Figure 7:
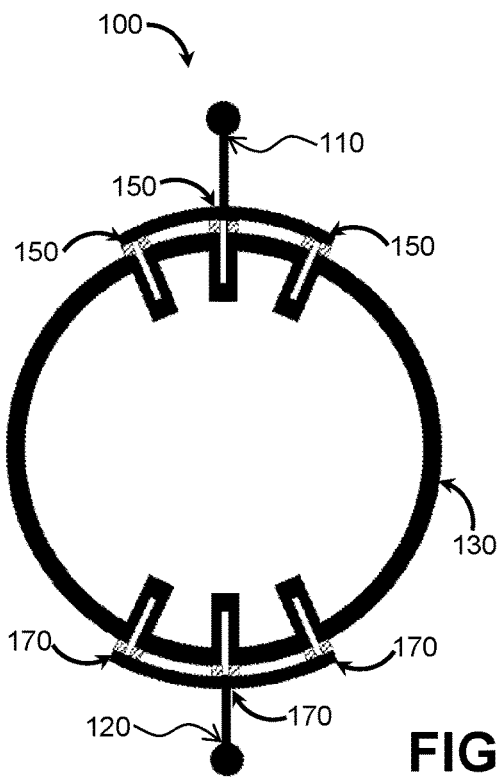
FIG. 7 shows parallel nanoSQUIDs at the input and output of a superconducting coupling loop, according to an exemplary embodiment of the present disclosure.
Figure 8:
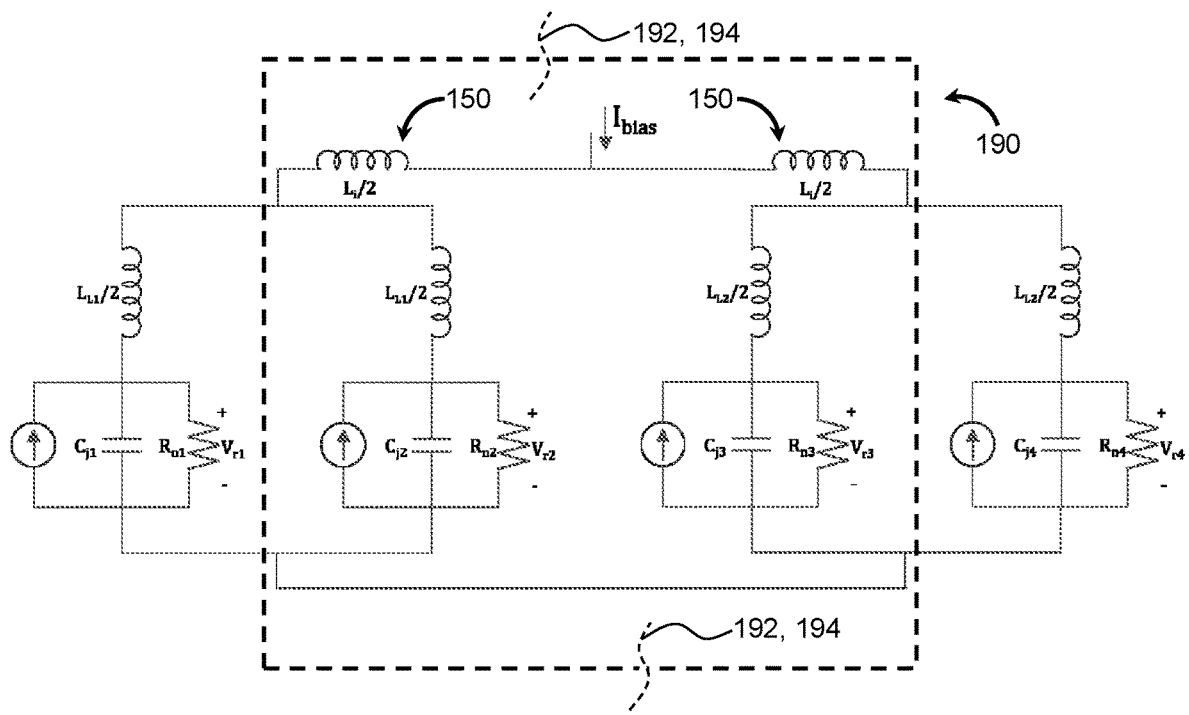
FIG. 8 schematically illustrates a RCSJ model for two DC SQUIDs in parallel, connected by an input line, according to an exemplary embodiment of the present disclosure.

FIG. 7 shows parallel nanoSQUIDs at the input and output of a superconducting coupling loop, according to an exemplary embodiment of the present disclosure. In particular, one or more additional nanoSQUIDs may be electrically coupled parallel with at least one of SQUIDs 150, 170 at the input and/or output of the superconducting coupling loop 130. Here, the parallel SQUIDs 150, 170 are also in series with each other. Contrast with FIG. 8, showing only two parallel SQUIDs 150.

As above, the electronic device 100 may include the first terminal 110, the second terminal 120, the superconducting coupling loop 130, and one or more SQUIDs 150, 170. Likewise, preferably, SQUID 150 may be identical to SQUID 170, other than its electrical placement.

According to one preferred embodiment, the electronic device 100 will include at least SQUIDs 150 electrically coupled in parallel and at least two SQUIDs 170 electrically coupled in parallel, with each parallel couple electrically coupled in series between the first terminal 110 and the superconducting coupling loop 130, between the superconducting coupling loop 130 and the second terminal 120, respectively (analogously to FIG. 6)

According to one exemplary embodiment, and as shown, the electronic device 100 may include three SQUIDs 150 electrically coupled in parallel and at least two SQUIDs 170 electrically coupled in parallel, with each parallel couple electrically coupled in series between the first terminal 110 and the superconducting coupling loop 130, between the superconducting coupling loop 130 and the second terminal 120, respectively. Thus, the superconducting coupling loop 130 have three parallel nanoSQUIDs coupled in series at both its input and the output. This circuit could be constructed with any number of nanoSQUIDs at the input or output, if they can physically fit into the area.

This arrangement may be advantageous because the noise of the nanoSQUIDs is reduced by $\sqrt{N}$, where N is the number of nanoSQUIDs in parallel. This reduction in noise may lead to a $\sqrt{N}$ increase in sensitivity. Further, this embodiment may require less wafer space than fabricating N additional superconducting coupling loops with nanoSQUIDs on them and placing them in parallel with the first superconducting coupling loop.

FIG. 8 schematically illustrates a RCSJ model for two DC SQUIDs in parallel, connected by an input line, according to an exemplary embodiment of the present disclosure. In particular, only two parallel SQUIDs 150 are shown. This is primarily for illustration purposes, buy may represent one alternate embodiment of the electronic device 100. As shown, the two parallel SQUIDs 150 are connected by an input line (e.g., to one of the first terminal 110 or the second terminal 120) with inductance Li. For clarity the label on the current sources in the Josephson Junctions has been removed.

An astute observer will note that the input connections to each of the parallel nanoSQUIDs may form the parasitic SQUID 190. In particular, the input line may create a third SQUID in the center which is considered the parasitic SQUID 190. This parasitic SQUID 190 is undesirable—the screening current that occurs in the parasitic SQUID 190 may diminish the screening current that flows through the Josephson Junction that is shared with the nanoSQUIDs. Therefore, any resultant parasitic SQUIDs 190 should be engineered to minimize their screening current. Generally, the parasitic SQUIDs 190 should be isolated, insolated, or otherwise disrupted electrically (e.g., via an electrical barrier 192), magnetically (e.g., via a magnetic flux shield 194), and/or physically (e.g., minimizing the coupling to the coupling loop while maximizing the total inductance of the parasitic SQUID 190). For example, the magnetic flux shield 194 may be embodied as a Lenz lens (FIG. 9) that is configured to keep flux from directly entering the parasitic SQUIDs 190.

According to one embodiment, a series of non-superconducting slits (electrical barrier 192) in the edge of perimeter of the coupling loop that are tangential to the edge of the coupling loop and between the coupling loop and the area enclosed by the parasitic SQUID 190 may be added. Advantageously, these slits may serve to reduce the amount of flux that is coupled into the parasitic SQUID 190.

Figure 9:
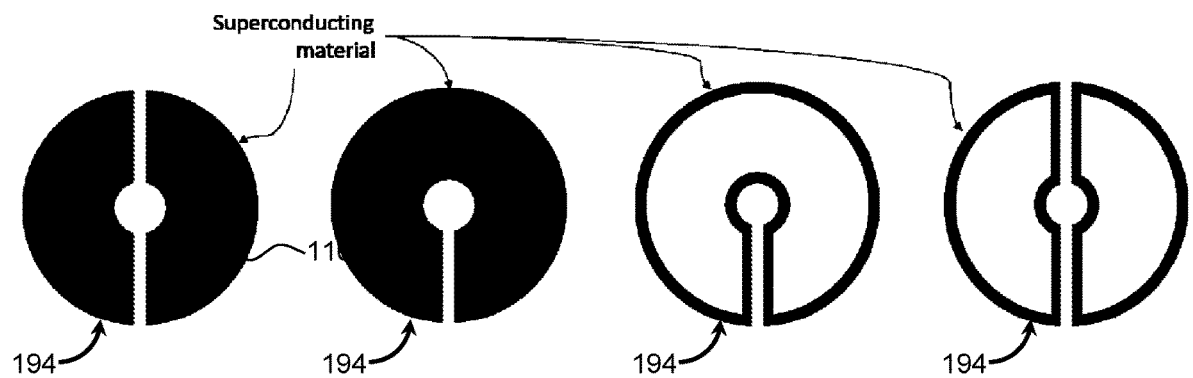
FIG. 9 illustrates four geometries for Lenz lenses made from superconducting material, according to an exemplary embodiment of the present disclosure.

FIG. 9 illustrates four geometries for Lenz lenses made from superconducting material, according to an exemplary embodiment of the present disclosure. As above, a magnetic flux shield 194 may be used to keep flux from directly entering the parasitic SQUID 190 (FIG. 8). As illustrated, according to one embodiment, a Lenz lens may be used as the magnetic flux shield 194. As shown, the exemplary geometries for Lenz lenses are made from a superconducting material. For reference, the dark area is superconducting while the white area is not. Each focuses flux into the white area in the center of the circles.

The Lenz lens (magnetic flux shield 194) may be configured to focus magnetic flux into the white region in the center of the circle, while blocking magnetic flux from entering any of the other regions that are covered or surrounded by superconductor. The Lenz lens can be fabricated on a second wafer and positioned next to the wafer containing nanoSQUID or SQUID electronics.

Figure 10:
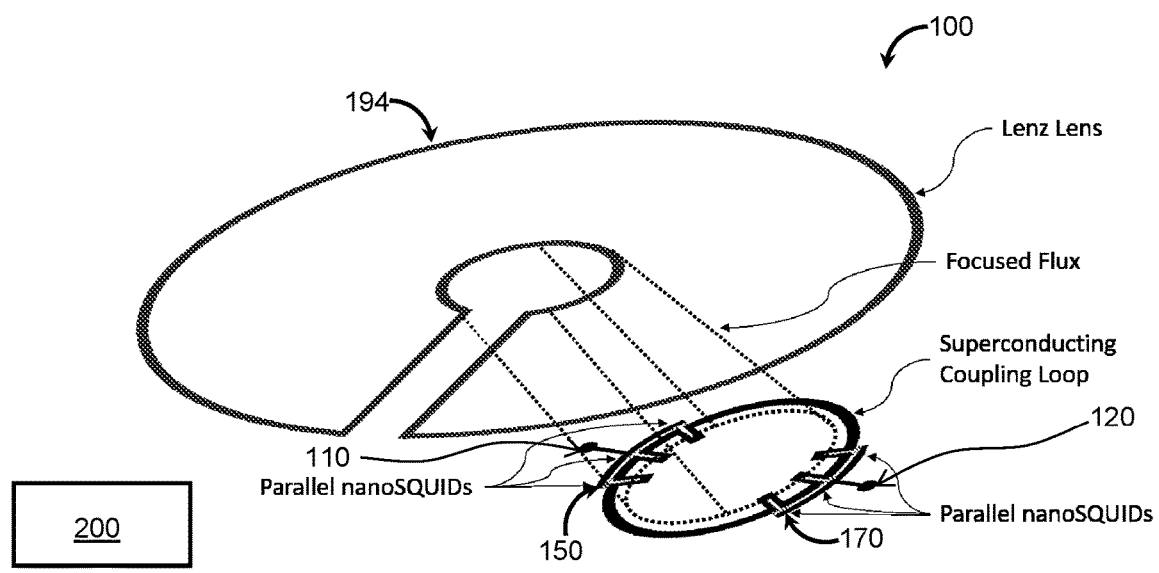
FIG. 10 illustrates a Lenz lens focusing magnetic flux into the coupling loop, according to an exemplary embodiment of the present disclosure.

According to this embodiment, the Lenz lens (magnetic flux shield 194) may be complementary to the features, because it can efficiently focus flux into the coupling loop, thereby increasing the effective area of the nanoSQUIDs. This is shown in FIG. 10. The Lenz lens shields flux from entering the secondary SQUIDs that are shown in FIG. 7. Further, a Lenz lens can shield flux from entering the Josephson Junctions on each nanoSQUID, which reduces the Fraunhofer effect in the nanoSQUID's flux to voltage transfer function. This Fraunhofer effect is undesirable because it can degrade the devices ability to operate in higher magnitude magnetic fields.

FIG. 10 illustrates a Lenz lens focusing magnetic flux into the coupling loop, according to an exemplary embodiment of the present disclosure. In particular, the Lenz lens (magnetic flux shield 194) may be configured to focus magnetic flux into the coupling loop. It may be further configured to shield flux from entering the parasitic SQUIDs 190 and the Josephson Junctions of the SQUIDs 150, 170.

The Lenz lens may also be configured to provide feedback or modulation to the SQUIDs 150, 170. Attaching electrodes to opposite sides of the inner circle will allow signals to be coupled into the SQUIDs 150, 170 via the Lenz lens (magnetic flux shield 194), which can be utilized to realize Flux Locked Loop (FLL) feedback. This solution will ensure that the FLL feedback signal is coupled into all the SQUIDs 150, 170 equally, and it will also save space on the wafer that contains the nanoSQUID electronics 200. The use of the Lenz lens as a flux focuser, flux shield, and as part of the FLL can be used with any arrangement of SQUIDs or nanoSQUIDs, with or without other flux focusing structures.

The nanoSQUID electronics 200 discussed in this disclosure can be used in a SQUID cascade, which exploits the SQUID's periodic voltage to flux transfer function to achieve extended dynamic range. The SQUID cascade is composed of multiple independent devices of different sensitivities, where each device can be composed of one or more of the nanoSQUID configurations previously described in this invention.

Alternatively, one or more, but not all, of the devices in the SQUID cascade might be fashioned from one or more of the nanoSQUID configurations described in the invention, while the other devices might be fashioned from other SQUID configurations or other magnetic field sensors. Each device in the SQUID cascade is responsible for encoding a defined number of bits of the signal. The least significant bits are encoded by the most sensitive device, the next least significant bits are encoded by a less sensitive device, and so on, until the full range of the signal can be encoded. There may be some overlap in the dynamic range of two devices that are adjacent to each other in terms of sensitivity; for example, the most sensitive device might encode the least significant 16 bits of the signal, while the second most sensitive device might encode the tenth through the twenty-sixth least significant bits, providing six bits of overlap between the two devices. The least sensitive device might encode bits 20 through 36 of the signal, providing an overall dynamic range on the order of 216 dB. This could also be implemented with a number of devices that is greater or less than three devices. It could also be implemented in a configuration where each device is not responsible for encoding the same number of bits; for example, the most sensitive device might only be responsible for encoding eight bits, while the other devices are responsible for 14 bits. This can be done to relax the requirements on the electronics that require the most precision.

Figure 11:
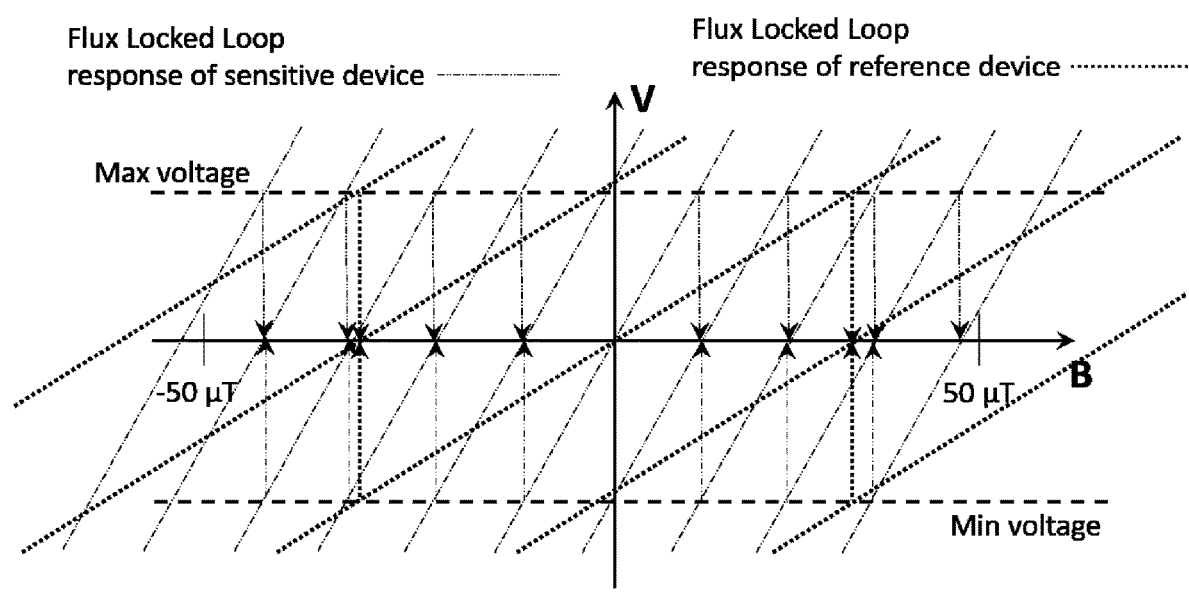
FIG. 11 illustrates a response of a Flux Locked Loop (FLL) output of a sensitive device and a reference device, according to an exemplary embodiment of the present disclosure.

FIG. 11 illustrates a response of a Flux Locked Loop (FLL) output of a sensitive device and a reference device, according to an exemplary embodiment of the present disclosure. When the FLL reaches the minimum or maximum voltage it resets to a new operating point. The less sensitive device is used to index into the more sensitive device. As will be understood by one having ordinary skill, the FFL may be incorporated in the nanoSQUID electronics 200 (FIG. 10) or elsewhere in a system incorporating the electronic device 100, and may vary substantially from application to application.

According to one embodiment, the electronic device 100 may be used as, integrated with, or otherwise applied as a Superconducting Quantum Interference Filter (SQIF). The SQIF combines many SQUIDs with different effective areas in series or parallel to create a sharp anti-peak at zero magnetic field in the SQIF's voltage vs. flux response. For example, the SQIF may incorporate any of the embodiments of the electronic device 100 discussed above and/or illustrated in the Figures.

According to one embodiment, the SQUIDs 150, 170 may be designed to have a minimum voltage response at zero magnetic field, and a periodic voltage response vs. flux as the magnetic field changes. The period of the voltage vs. flux response is a function of the effective area of the SQUID 150, 170. Accordingly, and in contrast to the discussion above, one or more SQUIDs 150, 170 may be unique or otherwise distinct from one or more others. For example, by giving a number of SQUIDs 150, 170 different effective areas, and by combining their responses, the voltage vs. flux response will have a sharp anti-peak at zero magnetic field.

Control electronics (e.g., nanoSQUID electronics 200) can be used to bias the SQIF at the steepest region of the anti-peak, where any received magnetic flux will induce a linear response in the SQIF output. SQIFs can also be used to create periodic voltage vs. flux responses by selecting the correct combination of SQUIDs 150, 170 with the correct effective areas.

According to one embodiment, the electronic device 100 may be used or integrated with control electronics, or otherwise applied to allow the SQIF voltage vs. flux response to be achieved. In particular, the electronic device 100 may increase or decrease the length of the SQUIDs 150, 170 so that their kinetic and geometric inductance increase or decrease. This in turn will increase or decrease the effective area of the SQUIDs 150, 170. According to one embodiment, the SQIF can also be created as a system by placing an array of superconducting coupling loops 130 in parallel, series, or a combination of the two, where each superconducting coupling loop 130 contains SQUIDs 150, 170 in parallel, series, or a combination of the two, as described above. For example, and as discussed above, a series SQIF system may be represented by arraying a plurality of the electronic devices 100 (shown in the figures) in series (i.e., electrically coupling the second terminal 120 of a first electronic device 100 to the first terminal 110 of a subsequent electronic device 100, and so on). Also for example, and as discussed above, a parallel SQIF system may be represented by arraying a plurality of the electronic devices 100 (shown in the figures) in parallel (i.e., electrically coupling the first terminal 110 of each electronic device 100 together, and electrically coupling the second terminal 120 of each electronic device 100 together).

As shown, in these embodiments, the electronic device 100 may benefit from the fact that the SQUIDs 150, 170 or SQUID array's voltage response does not saturate. The FLL that keeps the SQUID at a linear operating point will saturate, but it can be dis-engaged, allowing the SQUIDs 150, 170 to run, and then re-engaged in time to take a new sample. As shown, when the output of the FLL reaches a maximum or minimum voltage, it disengages and then re-engages, resetting the operating point. Then the FLL will linearize the device's output again and run until the FLL output saturates at the minimum or maximum voltage.

While the voltage output of only two devices is shown, it is understood that more devices may be used to achieve even higher dynamic range. Because there is ambiguity associated with the absolute magnetic field that a sensitive device is reading, the less sensitive device is used to index into the periodic response of the more sensitive device. This removes the ambiguity. The least sensitive device should be able to make a coarse measurement of the full range of the signal that the device will see. This coarse measurement indexes into the next device in the cascade, which indexes into the next device, and so on, providing an extended dynamic range.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention. The foregoing method descriptions and steps are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," etc. are not intended to limit the order of the steps; these words are simply used to guide the reader through the description of the methods.

The above description of the various embodiments is provided to enable a person of ordinary skill in the art to make or use the subject matter of the disclosure. Various modifications to the embodiments will be readily apparent to those skilled in the art, and the generic principles defined herein may be applied to other variations without departing from the spirit or the scope of this disclosure. Thus, it is to be understood that the disclosure is not intended to be limited to the examples and designs described herein, which merely represent a presently preferred implementation of the disclosure, but that the disclosure is to be accorded the widest scope consistent with the principles and novel features disclosed herein. It is to be further understood that the scope of the present disclosure fully encompasses other embodiments that may become obvious to those skilled in the art.

The invention claimed is:

1. An electronic device for sensing magnetic fields, the electronic device comprising:
   a first sensor terminal;
   a second sensor terminal;
   a superconducting loop defined as a continuous circuit of superconducting material, said superconducting loop electrically coupled in series between the first sensor terminal and the second sensor terminal; and
   a first Superconducting Quantum Interference Device (SQUID) including a first superconducting trace, a second superconducting trace, and a first pair of Josephson Junctions electrically coupled in parallel between the first superconducting trace and the second superconducting trace,
      the first SQUID electrically coupled in series between the first sensor terminal via the first superconducting trace, and the superconducting loop via the second superconducting trace, said second superconducting trace forming a first segment of the superconducting loop,
      the first superconducting trace having a first trace length as measured between one junction end of each of the first pair of Josephson Junctions, said first trace length being less than 999 nm,
      the second superconducting trace having a second trace length as measured between an other junction end of each of the first pair of Josephson Junctions, said second trace length being at least twice the first trace length.

2. The electronic device of claim 1, wherein the first superconducting trace linearly couples the one junction ends of each of the first pair of Josephson Junctions, the first superconducting trace defining a Josephson Junction width that is substantially the same as first trace length; and
   wherein the second superconducting trace rectilinearly couples the second junction ends of each of the first pair of Josephson Junctions, the second superconducting trace defining a Josephson Junction insertion depth measured perpendicularly from the first superconducting trace, the second trace length substantially being the sum of the Josephson Junction width and twice the Josephson Junction insertion depth.

3. The electronic device of claim 1, wherein the second trace length is at least seven times the first trace length.

4. The electronic device of claim 1, wherein the second trace length is at least twenty-five times the first trace length.

5. The electronic device of claim 1, wherein the first trace length is 200 nm±50%; and
   wherein the second trace length is 5000 nm±50%.

6. The electronic device of claim 1, wherein the first trace length is 200 nm±10%; and
   wherein the second trace length is 5000 nm±10%.

7. The electronic device of claim 1, further comprising a second SQUID including a third superconducting trace,
   a fourth superconducting trace, and a second pair of Josephson Junctions electrically coupled in parallel between the third superconducting trace and the fourth superconducting trace,
      the second SQUID electrically coupled in series between the second sensor terminal via the third superconducting trace, and the superconducting loop via the fourth superconducting trace, said fourth superconducting trace forming a second segment of the superconducting loop,
      the third superconducting trace having a third trace length as measured between one junction end of each of the second pair of Josephson Junctions, said third trace length being less than 999 nm,
      the fourth superconducting trace having a fourth trace length as measured between an other junction end of each of the second pair of Josephson Junctions, said fourth trace length being at least twice the third trace length.

8. The electronic device of claim 7, wherein the first SQUID and the second SQUID are positioned substantially opposite each other with respect to the superconducting loop.

9. The electronic device of claim 7, wherein the first SQUID and the second SQUID each include a plurality of SQUIDs electrically coupled in parallel.

10. The electronic device of claim 1, wherein the first SQUID includes a plurality of SQUIDs electrically coupled in parallel.

11. The electronic device of claim 1, further comprising a Lenz lens configured to shield the first SQUID.

12. The electronic device of claim 1, further comprising a cooling system including cryogenic equipment, the cooling system configured to cool the electronic device to a critical temperature.

13. The electronic device of claim 1, wherein the first SQUID includes a plurality of SQUIDs; and
   wherein the electronic device is configured as a Superconducting Quantum Interference Filter (SQIF).

14. The electronic device of claim 13, wherein the SQIF is configured as a series system including a plurality of additional electronic devices of claim 1 electrically coupled in series.

15. The electronic device of claim 14, wherein the SQIF is further configured as a series-parallel system including a plurality of additional electronic devices of claim 1 electrically coupled in parallel.

16. The electronic device of claim 13, wherein the SQIF is configured as a parallel system including a plurality of additional electronic devices of claim 1 electrically coupled in parallel.

17. The electronic device of claim 1, further comprising wherein the first SQUID includes a plurality of SQUIDs, the electronic device further comprising nanoSQUID electronics configured to provide Flux Locked Loop (FLL) feedback.

18. The electronic device of claim 1, wherein the first SQUID includes a plurality of SQUIDs configured as a SQUID cascade.

19. The electronic device of claim 1, further comprising a pickup coil electrically coupled to the superconducting loop, the pickup coil configured to increase the amount of flux that passes through the coupling loop via using secondary flux focusing.

20. An electronic device for sensing magnetic fields, the electronic device comprising:
- a first sensor terminal;
- a superconducting loop defined as a continuous circuit of superconducting material, said superconducting loop electrically coupled directly to the first sensor terminal;
- a Superconducting Quantum Interference Device (SQUID) including a first superconducting trace, a second superconducting trace, and a first pair of Josephson Junctions electrically coupled in parallel between the first superconducting trace and the second superconducting trace,
  - the SQUID electrically coupled directly to the superconducting loop via the second superconducting trace, said second superconducting trace forming a segment of the superconducting loop,
  - the first superconducting trace having a first trace length as measured between one junction end of each of the first pair of Josephson Junctions, said first trace length being less than 999 nm,
  - the second superconducting trace having a second trace length as measured between an other junction end of each of the first pair of Josephson Junctions, said second trace length being at least twice the first trace length; and
- a second sensor terminal electrically coupled directly to the first superconducting trace.

* * * * *